United States Patent
Fifield et al.

[19]

[11] Patent Number: 6,166,561

[45] Date of Patent: Dec. 26, 2000

[54] METHOD AND APPARATUS FOR PROTECTING OFF CHIP DRIVER CIRCUITRY EMPLOYING A SPLIT RAIL POWER SUPPLY

[75] Inventors: John A. Fifield; Christopher P. Miller, both of Underhill, Vt.

[73] Assignee: International Business Machines Corporation, Armonk, N.Y.

[21] Appl. No.: 09/258,358

[22] Filed: Feb. 26, 1999

[51] Int. Cl.[7] .............................. H03K 19/00; H03L 7/00
[52] U.S. Cl. ................................ 326/57; 326/57; 326/56; 326/58; 326/86; 326/119; 326/121; 327/143; 327/198; 327/112; 327/185
[58] Field of Search .................................. 326/57, 56, 58, 326/81, 80, 86, 87, 33, 63, 68, 112, 119, 121; 327/112, 185, 391, 143, 198

[56] References Cited

U.S. PATENT DOCUMENTS

| 4,847,522 | 7/1989 | Fuller et al. . |
| 4,884,165 | 11/1989 | Kong et al. . |
| 5,159,216 | 10/1992 | Taylor et al. . |
| 5,444,397 | 8/1995 | Wong et al. . |
| 5,469,082 | 11/1995 | Bullinger et al. . |
| 5,701,072 | 12/1997 | Jeon et al. ............................... 323/312 |
| 5,834,948 | 11/1998 | Yoshizaki et al. ........................ 326/81 |
| 5,917,339 | 6/1999 | Kim ......................................... 326/68 |
| 5,952,847 | 9/1999 | Plants et al. .............................. 326/80 |
| 6,020,762 | 2/2000 | Wilford .................................... 326/81 |
| 6,028,449 | 2/2000 | Schmitt .................................... 326/80 |

Primary Examiner—Michael Tokar
Assistant Examiner—Vibol Tan
Attorney, Agent, or Firm—Schmeiser, Olsen & Watts; Robert A. Walsh

[57] ABSTRACT

OCD circuitry is provided for an integrated circuit having a split rail power supply providing a first and a second voltage. The OCD circuitry comprises a tristate logic circuit adapted to control the OCD and a detection circuit coupled to the tristate logic circuit and adapted to generate an inactivation signal that inactivates the OCD if the first voltage is low. The detection circuit preferably comprises a comparator that compares the first voltage to the second voltage, and that generates the inactivation signal if the first voltage is less than the second voltage. To prevent the inadvertent inactivation of the OCD circuitry, the detection circuit preferably is provided with a filter that sets a minimum time period that the first voltage must be low before the detection circuit generates the inactivation signal and thus inactivates the OCD circuitry.

20 Claims, 5 Drawing Sheets

METHOD AND APPARATUS FOR PROTECTING OFF CHIP DRIVER CIRCUITRY EMPLOYING A SPLIT RAIL POWER SUPPLY

FIELD OF THE INVENTION

The present invention relates to off chip driver (OCD) circuitry and more particularly to a method and apparatus for protecting OCD circuitry employing a split rail power supply.

BACKGROUND OF THE INVENTION

Conventional OCD circuitry comprises an output control circuit (e.g., a tristate circuit) for driving data over a signal network such as a data bus and for placing the OCD circuitry in a high impedance state or in "tristate" to allow other devices access to the signal network. To couple the output control circuit to a signal network, the OCD circuitry further comprises output drive devices (e.g., pull-up and pull-down transistors) that drive data from the output control circuit over the signal network, and that place the OCD in tristate when disabled by the output control circuit.

OCD circuitry employing a split rail power supply typically includes a first power rail for supplying a first voltage to the output control circuit and a second power rail for supplying a second voltage to the output drive devices. As a consequence of the output control circuit being powered by a separate power rail (e.g., the first power rail), when a plurality of devices having OCD circuitry are coupled to a signal network, high current conditions can result within the signal network that damage the devices (i.e., deleteriously high current conditions) when the first power rail is at a low voltage (e.g., at power-on or due to a hardware failure) while the second power rail (e.g., the power rail that powers the output drive devices) is at its normal operating voltage (i.e., high) as described below with reference to FIG. 1.

Figure 1:
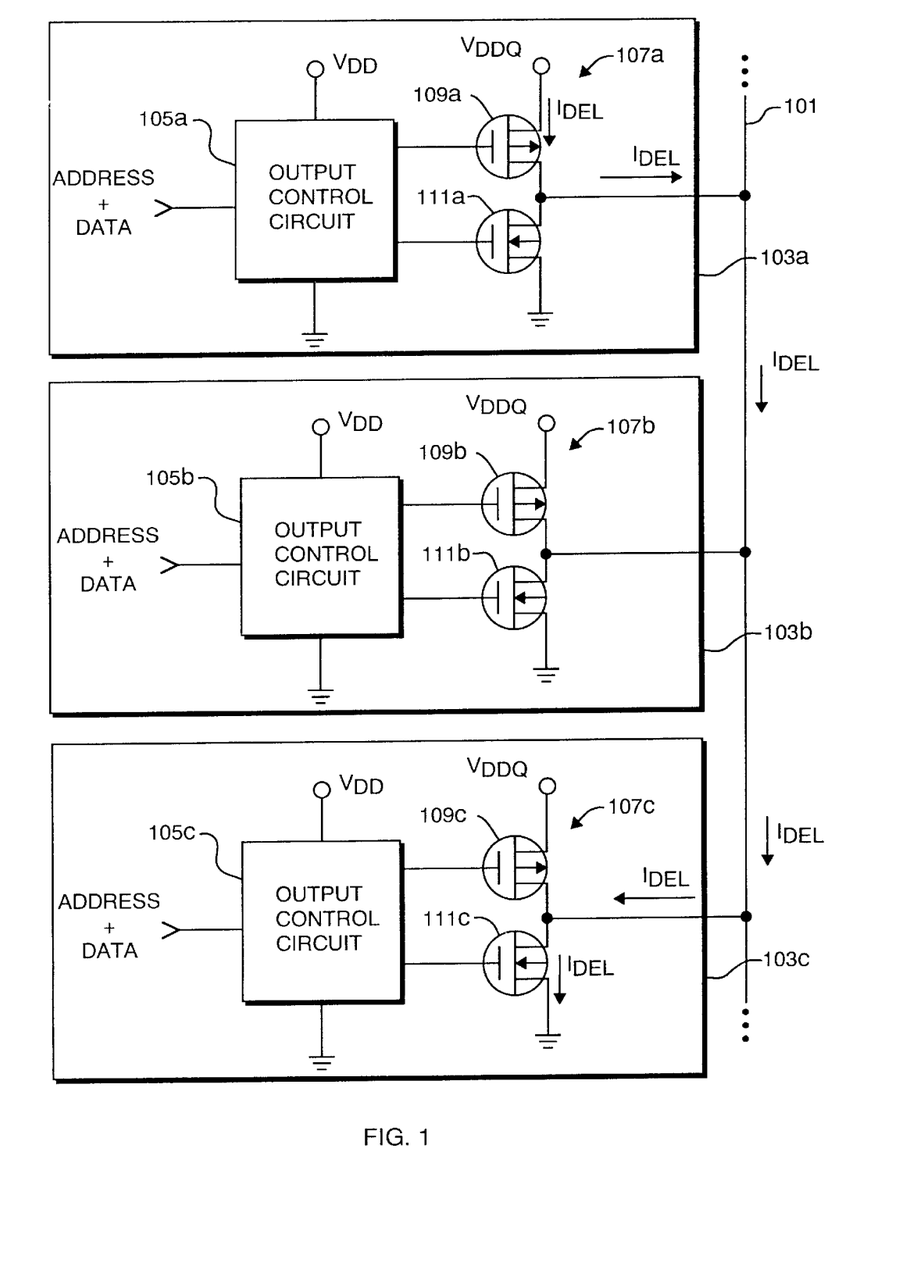
FIG. 1 is a schematic diagram of a conventional signal network having three memory chips connected thereto, as previously described.

FIG. 1 is a schematic diagram of a signal network 101 having three memory chips 103a–c connected thereto. Each memory chip 103a–c comprises an output control circuit 105a–c and output drive devices 107a–c connected to the output control circuit 105a-c and to the signal network 101 as shown. The output drive devices 107a–c of each memory chip 103a–c comprise a pull-up p-channel metal-oxide-semiconductor field-effect transistor (PFET) 109a–c and a pull-down n-channel metal-oxide-semiconductor field-effect transistor (NFET) 111a–c. The output control circuits 105a–c are powered via a first power rail (VDD) and the output drive devices 107a–c are powered via a second power rail ($V_{DDQ}$).

During normal operation, only one of the memory chips 103a–c at a time drives data over the signal network 101, and the remainder of the memory chips are placed in tristate (e.g., by disabling each memory chip's output drive devices). However, if the first power rail ($V_{DD}$) is low (e.g., at power-on or due to a hardware failure) while the second power rail ($V_{DDQ}$) is high, the output state of each output control circuit 105a–c is unknown, more than one memory chip 103a-c may drive data over the signal network 101 and a deleteriously high current condition may result that damages one or more of the memory chips 103a–c. For example, if the pull-up PFET 109a of the first memory chip 103a is ON while the pull-down NFET 111c of the third memory chip 103c is ON, a high current path exists between the second power rail ($V_{DDQ}$) and ground that produces a deleteriously high current ($I_{DEL}$) as shown. The current $I_{DEL}$ may damage both the first and the third memory chips 103a, 103c if sufficient in magnitude. Accordingly, a need exists for a method and apparatus for protecting OCD circuitry employing a split rail power supply from deleteriously high current conditions.

SUMMARY OF THE INVENTION

To overcome the needs of the prior art, inventive OCD circuitry is provided for an integrated circuit having a split rail power supply providing a first and a second voltage. The inventive OCD circuitry comprises a tristate logic circuit adapted to control the OCD and a detection circuit coupled to the tristate logic circuit and adapted to generate an inactivation signal that inactivates the OCD if the first voltage is low. As used herein "inactivate" means to disable the OCD (e.g., to place the OCD in a tristate condition) regardless of the output state of the tristate logic circuit (e.g., so as to prevent the tristate logic circuit from inadvertently driving data over a signal network and creating a deleteriously high current condition).

The detection circuit of the inventive OCD circuitry preferably comprises a comparator that compares the first voltage to the second voltage, and that generates the inactivation signal if the first voltage is less than the second voltage. To prevent the inadvertent inactivation of the OCD circuitry (e.g., due to a glitch in the first voltage), the detection circuit preferably is provided with a filter (e.g., an RC filter) that sets a minimum time period that the first voltage must be low before the detection circuit generates the inactivation signal and thus inactivates the OCD circuitry.

To inactivate the OCD circuitry, the detection circuit preferably comprises an inactivation driver that generates the inactivation signal if the first voltage is low, and the tristate logic circuit preferably comprises an inactivation circuit coupled to the inactivation driver that inactivates the OCD in response to (e.g., in direct or in indirect response to) the inactivation signal. For example, the inactivation circuit may comprise a first inactivation device (e.g., a PFET) connected to the inactivation driver and to a first output transistor of the OCD (e.g., a pull-up transistor) and a second inactivation device (e.g., an NFET) connected to the inactivation driver and to a second output transistor of the OCD (e.g., a pull-down transistor) that inactivate the first and second output transistors of the OCD in response to the inactivation signal.

The inventive OCD circuitry prevents deleteriously high current conditions and device damage associated therewith by inactivating the OCD when the first voltage is low, and preferably only when the first voltage is low for at least a predetermined time period (e.g., preferably about 200 nanoseconds). In this manner, power supply noise common in most split rail applications (e.g., due to turning ON or OFF components coupled to the power supply, due to inductive spikes during current switching, due to address-induced power supply droop, etc.) will not inadvertently inactivate the OCD. Only legitimate power supply failures will inactivate the OCD.

Other objects, features and advantages of the present invention will become more fully apparent from the following detailed description of the preferred embodiments, the appended claims and the accompanying drawings

BRIEF DESCRIPTION OF THE DRAWINGS

The present invention is described with reference to the accompanying drawings. In the drawings, like reference numbers indicate identical or functionally similar elements.

Additionally, the left-most digit of a reference number identifies the drawing in which the reference number first appears.

DETAILED DESCRIPTION OF THE PREFERRED EMBODIMENTS

Figure 2:
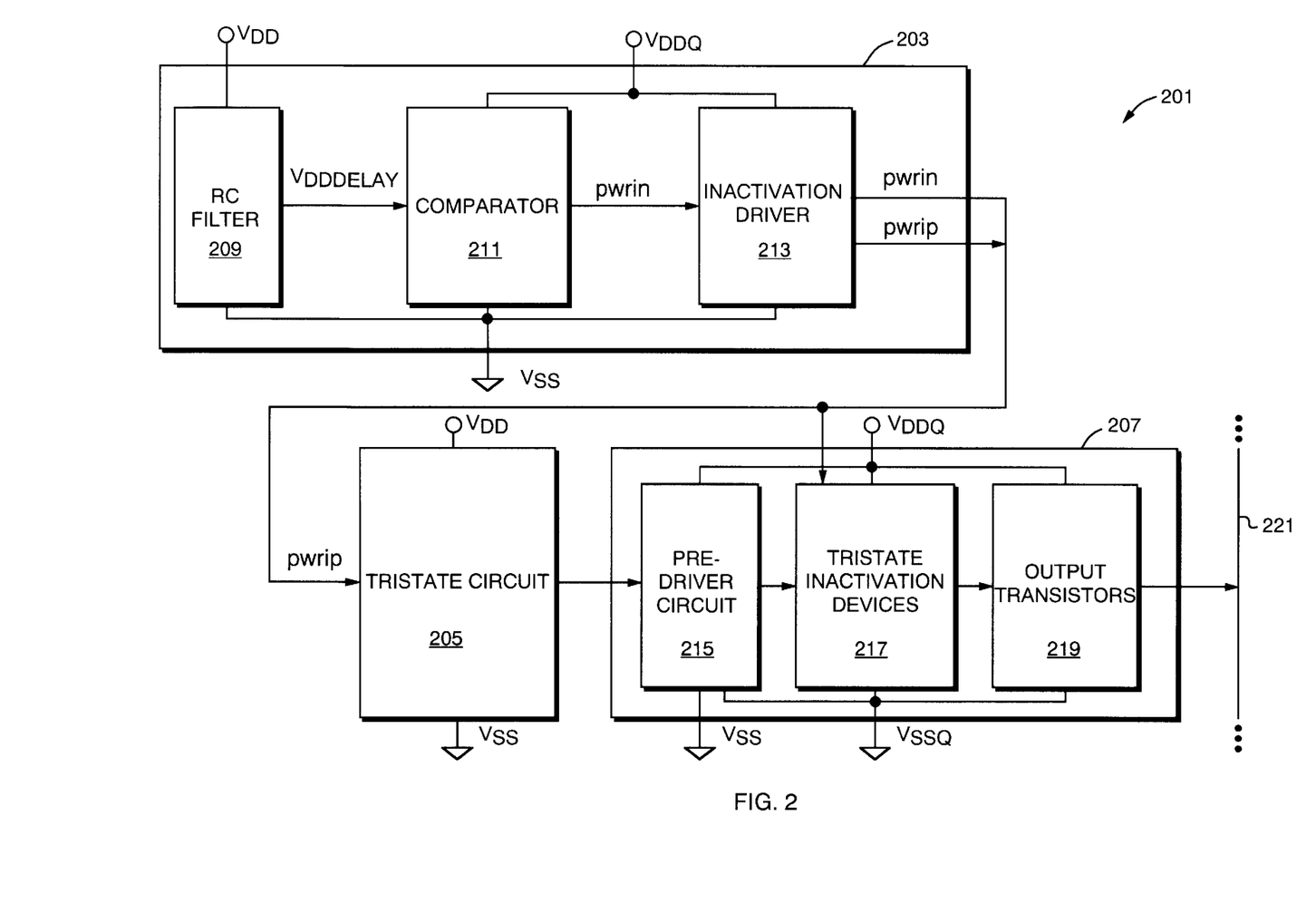
FIG. 2 is a block diagram of the main functional units of inventive OCD tristate circuitry for providing protection from deleteriously high current conditions within a split rail power supply application.

FIG. 2 is a block diagram of the main functional units of inventive OCD tristate circuitry 201 for providing protection from deleteriously high current conditions within a split rail power supply application employing a first power rail ($V_{DD}$), a second power rail ($V_{DDQ}$), a first reference rail ($V_{SS}$) (e.g., a first ground plane), and a second reference rail ($V_{SSQ}$) (e.g., a second ground plane). A typical voltage for the first power rail ($V_{DD}$) and for the second power rail ($V_{DDQ}$) is 2.5 volts. In general, however, the voltage of the first power rail ($V_{DD}$) may be higher or lower than the voltage of the second power rail ($V_{DDQ}$).

With reference to FIG. 2, the inventive OCD tristate circuitry 201 comprises a $V_{DD}$ detection circuit 203 connected to a tristate circuit 205, and an OCD logic and drive device circuit 207 connected to both the $V_{DD}$ detection circuit 203 and to the tristate circuit 205. Additionally, the $V_{DD}$ detection circuit 203 is connected to the first power rail ($V_{DD}$), to the second power rail ($V_{DDQ}$), and to the first reference rail ($V_{SS}$). The tristate circuit 205 is connected to the first power rail ($V_{DD}$) and to the first reference rail ($V_{SS}$), and the OCD logic and drive device circuit 207 is connected to the second power rail ($V_{DDQ}$), to the first reference rail ($V_{DD}$) and to the second reference rail ($V_{SSQ}$).

The $V_{DD}$ detection circuit 203 comprises an RC filter 209 connected to a comparator 211, and an inactivation driver 213 connected to the comparator 211. As shown in FIG. 2, the RC filter 209 also is connected between the first power rail ($V_{DD}$) and the first reference rail ($V_{SS}$), and the comparator 211 and the inactivation driver 213 are connected between the second power rail ($V_{DDQ}$) and the first reference rail ($V_{SS}$). The inactivation driver 213 is further connected to the tristate circuit 205.

The OCD logic and drive device circuit 207 comprises pre-driver amplifier circuits 215 connected to tristate inactivation devices 217, and output transistors 219 connected to the tristate inactivation devices 217. The 30 pre-driver amplifier circuits 215, the tristate inactivation devices 217 and the output transistors 219 also are each connected between the second power rail ($V_{DDQ}$) and the second reference rail ($V_{SSQ}$). The pre-driver amplifier circuits 215 additionally are connected to the first reference rail ($V_{SS}$) and to the tristate circuit 205, and the tristate inactivation devices 217 are connected to the inactivation driver 213 of the VDD detection circuit 203 as shown.

During normal operation of the inventive OCD tristate circuitry 201 (e.g., with both $V_{DD}$ and $V_{DDQ}$ high), the tristate circuit 205 controls the output state of the OCD tristate circuitry 201. For example, assuming the OCD tristate circuitry 201 is coupled to a signal network 221 such as a data bus, the tristate circuit 205 either directs the OCD logic and drive device circuit 207 to drive data over the signal network 221, or places the OCD logic and drive device circuit 207 in a tristate condition (e.g., to allow other circuitry access to the signal network 221).

If, however, the first power rail ($V_{DD}$) is inadvertently grounded (e.g., during startup of the OCD tristate circuitry 201 or due to a hardware failure) while the second power rail ($V_{DDQ}$) is high, the $V_{DD}$ detection circuit 203 inactivates the OCD logic and drive device circuit 207 to prevent deleteriously high current conditions on the signal network 221. Specifically, as described further below with reference to FIG. 3A, if the first power rail ($V_{DD}$) remains at a low voltage (e.g., ground) for a sufficient time period (set by the RC filter 209), the RC filter 209 generates an output signal (e.g., $V_{DDDELAY}$) in response to the low voltage on the first power rail ($V_{DD}$) In response thereto, the comparator 211 outputs a first inactivation signal (e.g., pwrin) to the inactivation driver 213 and to the tristate inactivation devices 217 (e.g., via the inactivation driver 213), and the inactivation driver 213 outputs a second inactivation signal (e.g., pwrip) to the tristate circuit 205 and to the tristate inactivation devices 217.

In response to the first and the second inactivation signals, the tristate inactivation devices 217 inactivate the output transistors 219 (e.g., place the output transistors 219 in tristate regardless of the output of the tristate circuit 205), and in response to the second inactivation signal, the tristate circuit 205 is disabled.

The OCD tristate circuitry 201 thereby is forced to a high impedance state regardless of the voltage levels output by the tristate circuit 205, and deleteriously high current conditions on the signal network 221 are avoided.

Figures 3A, 3B:
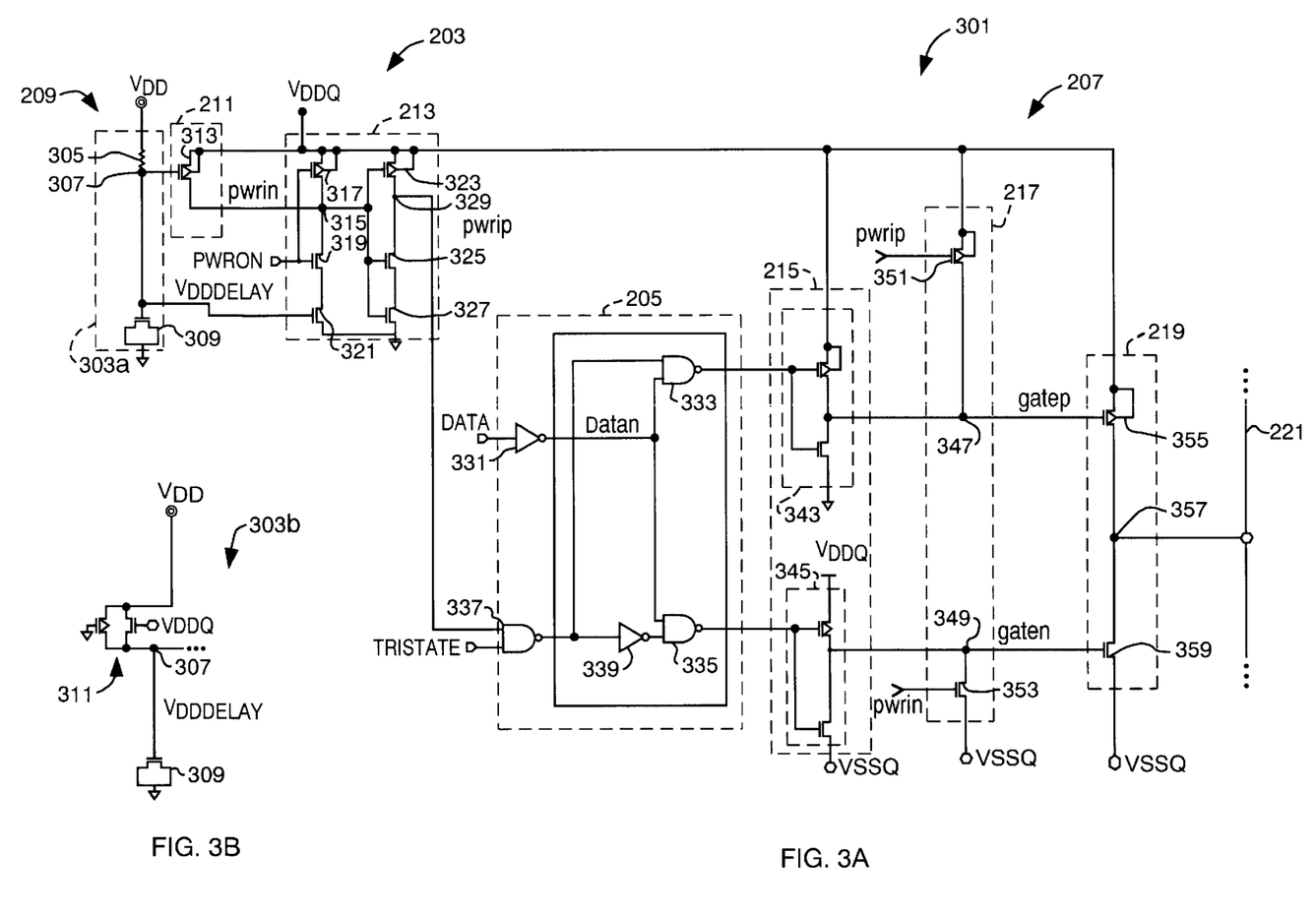
FIG. 3A is a schematic diagram of OCD tristate circuitry that represents a preferred embodiment for the inventive OCD tristate circuitry of FIG. 2.
FIG. 3B is a schematic diagram of an alternative RC filter for use within the inventive OCD tristate circuitry of FIG. 3A.

FIG. 3A is a schematic diagram of OCD tristate circuitry 301 that represents a preferred embodiment for the OCD tristate circuitry 201 of FIG. 2. The OCD tristate circuitry 301 comprises the $V_{DD}$ detection circuit 203 having the RC filter 209 therein (e.g., an RC filter 303a, or alternatively an RC filter 303b as shown in FIG. 3B) connected between the first power rail ($V_{DD}$) and the first reference rail ($V_{SS}$). The RC filter 303a comprises a low pass filter formed from a conventional resistor 305 connected between the first power rail ($V_{DD}$) and a first node 307, and a capacitor 309 connected between the first node 307 and the first reference rail ($V_{SS}$). The capacitor 309 preferably comprises an NFET as shown.

The RC filter 303b of FIG. 3B represents an alternative embodiment to the RC filter 303a and comprises a low pass filter formed from a transistor-based resistor 311 connected between the first power rail ($V_{DD}$) and the first node 307, and the capacitor 309 connected between the first node 307 and the first reference rail ($V_{SS}$). The transistor-based resistor 311 preferably comprises an NFET and a PFET connected in parallel between the first power rail ($V_{DD}$) and the first node 307 as shown. The RC filter 303b has the advantage that the transistor-based resistor 311 is smaller and therefore takes up less chip area than the conventional resistor 305. However, the transistor-based resistor 311 provides an asymmetric response (e.g., asymmetrical channel resistance) to voltage changes of the first power rail ($V_{DD}$), and therefore is mentioned as an alternative embodiment.

The $V_{DD}$ detection circuit 203 further comprises the comparator 211 (e.g., a comparator PFET 313) that has its gate connected to the first node 307 of the RC filter 303a, its source connected to the second power rail ($V_{DDQ}$) and its drain connected to a second node 315.

The inactivation driver 213 of the $V_{DD}$ detection circuit 203 comprises a first driver PFET 317, a first driver NFET 319 and a second driver NFET 321 connected between the second power rail ($V_{DDQ}$) and the first reference rail ($V_{SS}$), and a second driver PFET 323, a third driver NFET 325 and a fourth driver NFET 327 connected between the second power rail ($V_{DDQ}$) and the first reference rail ($V_{SS}$).

The gates of the first driver PFET 317 and the first driver NFET 319 are connected to a power-on reset terminal (PWRON).

The source of the first driver PFET 317 is connected to the second power rail ($V_{DDQ}$) and its drain is connected to the second node 315. The drain of the first driver NFET 319 is connected to the second node 315 and its source is connected to the drain of the second driver NFET 321. The gate of the second driver NFET 321 is connected to the first node 307 of the RC filter 303a, and its source is connected to the first reference rail ($V_{SS}$).

The gates of the second driver PFET 323, the third driver NFET 325, and the fourth driver NFET 327 are connected to the second node 315. The source of the second driver PFET 323 is connected to the second power rail ($V_{DDQ}$), and its drain is connected to a third node 329. The drain of the third driver NFET 325 is connected to the third node 329 and its source is connected to the drain of the fourth driver NFET 327. The source of the fourth driver NFET 327 is connected to the first reference rail ($V_{SS}$).

The tristate circuit 205 comprises a first inverter 331 connected to a NOR gate 333 and to a first NAND gate 335, and a second NAND gate 337 connected to the NOR gate 333, and connected to the first NAND gate 335 via a second inverter 339. Specifically, the first inverter 331 has an input connected to a data input terminal (DATA) of the OCD tristate circuitry 301 and an output connected to a first input of the NOR gate 333 and to a first input of the first NAND gate 335. The second NAND gate 337 has a first input connected to the third node 329 of the inactivation driver 213, a second input connected to a tristate input terminal (TRISTATE) of the OCD tristate circuitry 301, and an output connected to a second input of the NOR gate 333 and to an input of the second inverter 339. The output of the second inverter 339 is connected to a second input of the first NAND gate 335.

As previously stated, the OCD logic and drive device circuit 207 comprises pre-driver amplifier circuits 215, tristate inactivation devices 217 and output transistors 219. The pre-driver amplifier circuits 215 comprise a first CMOS inverter 343 connected between the second power rail ($V_{DDQ}$) and the first reference rail ($V_{SS}$), and a second CMOS inverter 345 connected between the second power rail ($V_{DDQ}$) and the second reference rail ($V_{SSQ}$). The first CMOS invertor 343 has an input connected to the output of the NOR gate 333 and an output connected to a fourth node 347, and the second CMOS inverter 345 has an input connected to the output of the first NAND gate 335 and an output connected to a fifth node 349.

The tristate inactivation devices 217 comprise an inactivation PFET 351 having its gate connected to the third node 329 of the inactivation driver 213, its source connected to the second power rail ($V_{DDQ}$) and its drain connected to the fourth node 347 and an inactivation NFET 353 having its gate connected to the second node 315 of the inactivation driver 213, its drain connected to the fifth node 349, and its source connected to the second reference rail ($V_{SSQ}$). The output transistors 219 comprise an output PFET 355 having its gate connected to the fourth node 347, its source connected to the second power rail ($V_{DDQ}$) and its drain connected to an output node 357, and an output NFET 359 having its gate connected to the fifth node 349, its drain connected to the output node 357 and its source connected to the second reference rail ($V_{SSQ}$). The output node 357 serves as the output of the OCD tristate circuitry 301.

Under normal operating conditions, the first power rail ($V_{DD}$) and the second power rail ($V_{DDQ}$) are both at a high voltage level, typically about 2.5 volts, the PWRON terminal is held high, and the tristate circuit 205 controls the output state of the OCD tristate circuitry 301. For example, with the first power rail ($V_{DD}$) high, the first node 307 also is high, the comparator PFET 313 is OFF and the second driver NFET 321 is ON. With the PWRON terminal held high, the first driver PFET 317 is OFF and the first driver NFET 319 is ON. Accordingly, the second node 315 is pulled to a low voltage level.

With the second node 315 pulled low, the second driver PFET 323 is ON, the third driver NFET 325 and the fourth driver NFET 327 are OFF, and the third node 329 is pulled high via the second driver PFET 323. Because the gate of the inactivation NFET 353 is connected to the second node 315 and the gate of the inactivation PFET 351 is connected to the third node 329, the second node 315's low voltage ensures that the inactivation NFET 353 is OFF and the third node 329's high voltage ensures that the inactivation PFET 351 is OFF. Accordingly, the output transistors 219 (e.g., the output PFET 355 and the output NFET 359) can be controlled by the tristate circuit 205.

The high voltage on the third node 329 also enables the tristate circuit 205. That is, with the first input of the second NAND gate 337 forced high by the third node 329, the TRISTATE terminal controls the voltage output by the second NAND gate 337. For example, to place the OCD tristate circuitry 301 in tristate, the TRISTATE terminal is held low. In response thereto, the output of the second NAND gate 337 is forced high, which in turn forces the output of the NOR gate 333 low and the output of the first NAND gate 335 high. A low voltage at the output of the NOR gate 333 generates a high voltage at the gate of the output PFET 355 (due to the first CMOS inverter 343) which disables the output PFET 355. A high voltage at the output of the first NAND gate 335 generates a low voltage at the gate of the output NFET 359 (due to the second CMOS inverter 345) which disables the output NFET 359. With both output transistors 219 disabled, the OCD tristate circuitry 301 is placed in tristate.

To drive data over the signal network 221, the TRISTATE terminal of the second NAND gate 337 is held high such that the output of the second NAND gate 337 is forced low, the second input of the NOR gate 333 is forced low and the second input of the first NAND gate 335 is forced high, and data is driven over the signal network 221 via the DATA terminal. For example, if a low voltage level is input to the DATA terminal, the output of the NOR gate 333 is low, the gate of the output PFET 355 is high, and the output PFET 355 is disabled. However, the output of the first NAND gate 335 also is low, the gate of the output NFET 359 is high and the output NFET 359 is ON. Therefore, the signal network 221 is pulled low via the output NFET 359, and the low voltage input to the DATA terminal is driven over the signal network 221. Likewise, when a high voltage is input to the DATA terminal, the output PFET 355 is ON, the output NFET 359 is disabled, and the signal network 221 is pulled high via the output PFET 355 so that the high voltage input to the DATA terminal is driven over the signal network 221.

The power-on reset terminal (PWRON) is used to place the OCD tristate circuitry 301 in tristate during normal power-up. With the PWRON terminal held low, the first driver PFET 317 is ON and the second node 315 is pulled high. The high voltage of the second node 315 turns ON the third and the fourth driver NFETs 325, 327 (pulling low the third node 329) and disables the tristate circuit 205 via the second NAND gate 337. The high voltage of the second node 315 and the low voltage of the third node 329 turn ON the tristate inactivation devices 217 (e.g., the inactivation NFET 353 and the inactivation PFET 351, respectively) which in turn inactivate the OCD tristate circuitry 301's output transistors 219 (e.g., the output NFET 359 and the output PFET 355, respectively). The OCD tristate circuitry 301 thereby is placed in tristate.

During abnormal operating conditions when the first power rail ($V_{DD}$) is low and the second power rail ($V_{DDQ}$) is high (e.g., during abnormal power-up or during a hardware failure), the $V_{DD}$ detection circuit 203 inactivates the OCD logic and drive device circuit 207, thereby protecting the signal network 221 from deleteriously high current conditions. For example, when the first power rail ($V_{DD}$) remains low for a sufficient time period (dictated by the RC characteristics of the RC filter 303a, such as the discharging time of the capacitor 309), the voltage of the first node 307 (e.g., $V_{DDDELAY}$) discharges to a low voltage. In response thereto, the comparator PFET 313 of the comparator 211 turns ON, the second node 315 is pulled high (e.g., generating a first inactivation signal pwrin), and the second driver NFET 321 turns OFF. With the second node 315 high, the second driver PFET 323 turns OFF, the third and the fourth driver NFETs 325, 327 turn ON and the third node 329 is pulled low (e.g., generating a second inactivation signal pwrip). The high voltage of the second node 315 (e.g., the first inactivation signal pwrin) and the low voltage of the third node 329 (e.g., the second inactivation signal pwrip) turn ON the tristate inactivation devices 217 (e.g., the inactivation NFET 353 and the inactivation PFET 351, respectively), which in turn inactivate the OCD tristate circuitry's output transistors 219 (e.g., the output NFET 359 and the output PFET 355, respectively). The low voltage of the third node 329 also disables the tristate circuit 205 by forcing the output of the second NAND gate 337 high (e.g., forcing the output of the NOR gate 333 low and the output of the first NAND gate 335 high). The OCD tristate circuitry 301 thereby is placed in tristate, regardless of the input signals present on the DATA and TRISTATE terminals.

When the first power rail ($V_{DD}$) returns to a high voltage, the first node 307 charges toward the high voltage with a time constant set by the conventional resistor 305 and the capacitor 309. Once sufficiently charged, the voltage of the first node 307 turns OFF the comparator PFET 313, turns ON the second driver NFET 321 and the second node 315 is pulled low. In response thereto, the second driver PFET 323 turns ON and the third node 329 is pulled high.

Thus, with the voltage of the second node 315 low and the voltage of the third node 329 high, the inactivation PFET 351 and the inactivation NFET 353 are OFF, the tristate circuit 205 is enabled and the output transistors 219 are activated (e.g., the tristate circuit 205 may control the output of the OCD tristate circuitry 301).

A significant advantage of the inventive OCD tristate circuitry 301 is that it only inactivates the output transistors 219 if the first voltage rail ($V_{DD}$) drops in voltage for at least a minimum time period sufficient to discharge the first node 307 (e.g., preferably about 200 nanoseconds). In this manner, power supply noise common in most split rail power supply applications (e.g., due to turning components coupled to the first and the second power rails ($V_{DD}$), ($V_{DDQ}$) ON or OFF, due to inductive spikes during current switching, due to address-induced power supply droop, etc.) will not inadvertently inactivate the output transistors 219. Only legitimate power rail failures will tristate the OCD tristate circuitry 301.

Figure 4A:
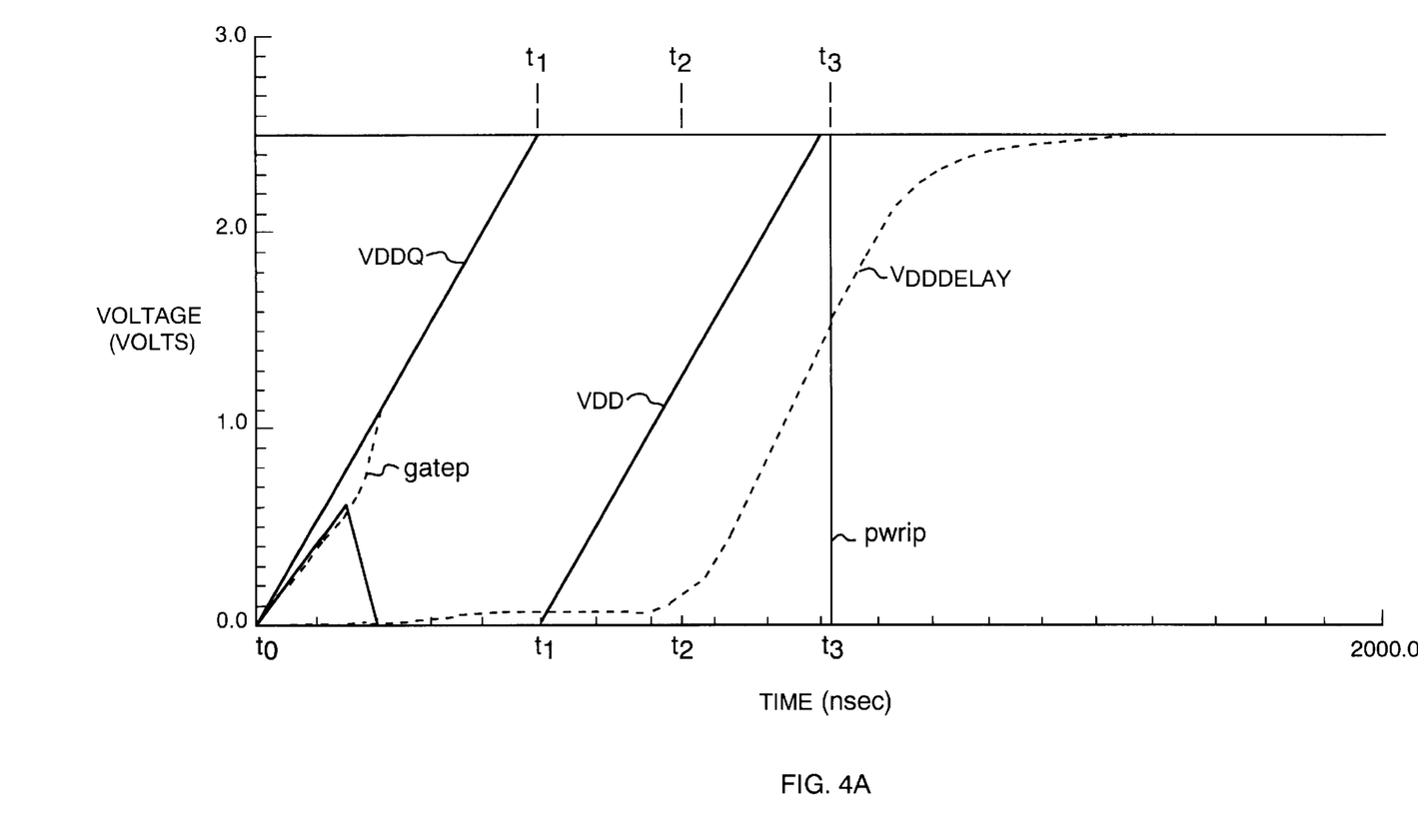
FIG. 4A is a simulation of the temporal behavior of the inventive OCD tristate circuitry of FIG. 3A in response to a power-up sequence.

FIG. 4A is a simulation of the temporal behavior of the first power rail ($V_{DD}$), the second power rail ($V_{DDQ}$) and the voltage of the first node 307 ($V_{DDDELAY}$) of the OCD tristate circuitry 301 in response to a power-up sequence wherein the second power rail ($V_{DDQ}$) becomes active before the first power rail ($V_{DD}$). The vertical axis represents voltage (in volts) and the horizontal axis represents time (in nanoseconds). Between times $t_0$ and $t_1$, the second power rail ($V_{DDQ}$) rises from 0 to 2.5 volts. As the second power rail ($V_{DDQ}$) rises, the comparator PFET 313 turns ON, and the voltage of the second node 315 (not shown) tracks the voltage of the second power rail ($V_{DDQ}$). In response thereto, the voltage of the third node 329 (pwrip) drops to zero, the inactivation PFET 351 turns ON, and the voltage of the fourth node 347 (gatep) tracks the second power rail ($V_{DDQ}$) as shown in FIG. 4A.

At time $t_1$, the first power rail ($V_{DD}$) begins to rise from 0 to 2.5 volts, and the voltage of the first node 307 ($V_{DDDELAY}$) begins to charge toward the voltage of the first power rail ($V_{DD}$). However, due to the RC time constant of the RC filter 303a, the voltage of the first node 307 ($V_{DDDELAY}$) lags the voltage of the first power rail ($V_{DD}$) by about 200–250 nanoseconds as indicated by time $t_2$.

At time $t_3$ the voltage of the first node 307 ($V_{DDDELAY}$) exceeds the turn-ON voltage of the second driver NFET 321, the second driver NFET 321 turns ON and the voltage of the second node 315 is quickly pulled low. In response thereto, the second driver PFET 323 turns ON, the third node 329 (pwrip) is pulled high (as shown) and the output transistors 219 of the OCD tristate circuitry 301 are activated as previously described.

Figure 4B:
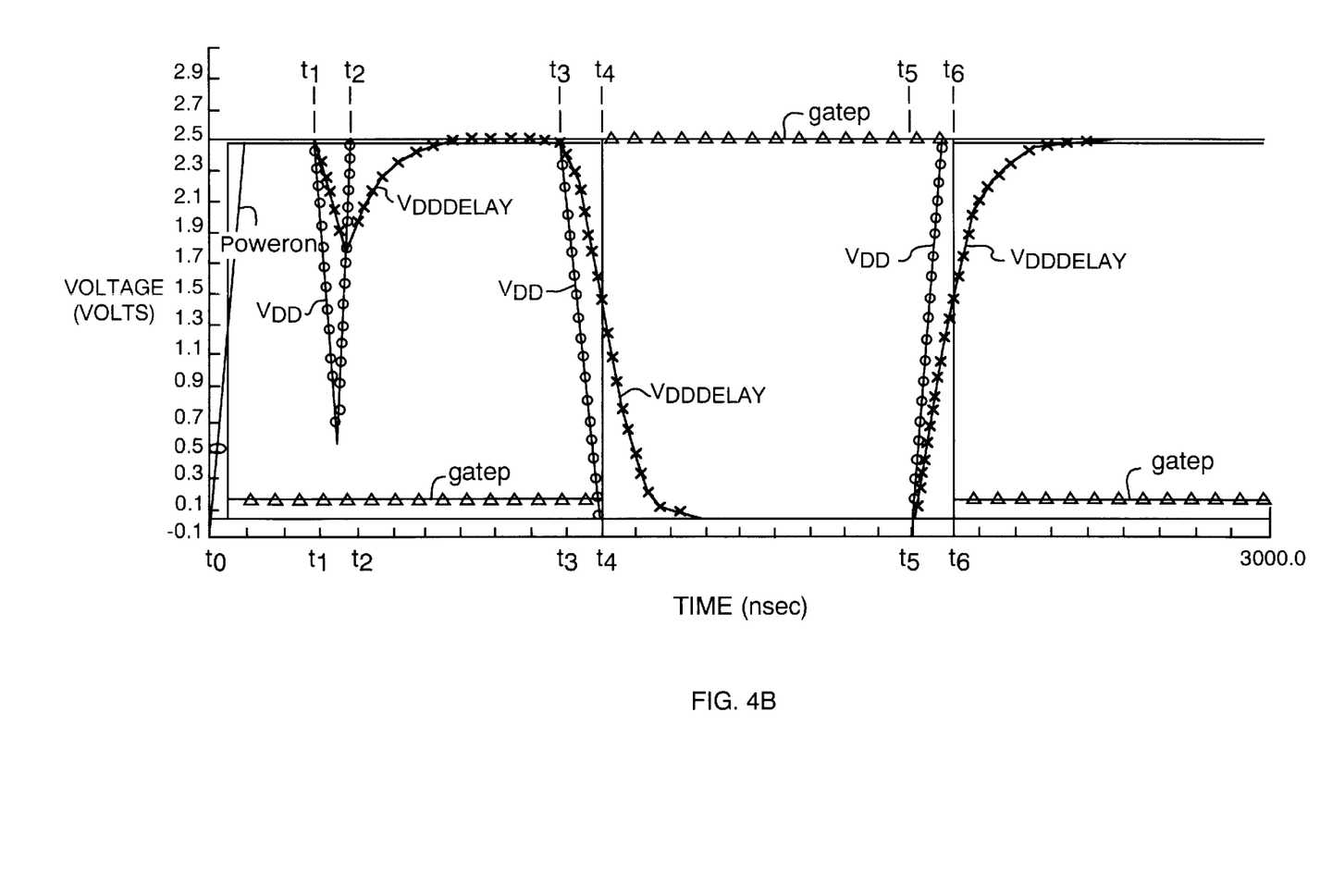
FIG. 4B is a simulation of the temporal behavior of the inventive OCD tristate circuitry of FIG. 3A in response to a voltage drop in a first power rail.

FIG. 4B is a simulation of the temporal behavior of the first power rail ($V_{DD}$) and of the voltage of the first node 307 ($V_{DDDELAY}$) of the OCD tristate circuitry 301 in response to a voltage drop in the first power rail ($V_{DD}$). With reference to FIG. 4B, between times $t_0$ and $t_1$, the OCD tristate circuitry 301 operates normally (e.g., the first power rail ($V_{DD}$), the second power rail ($V_{DDQ}$) and the PWRON terminal are all high). Thereafter, between times $t_1$ and $t_2$, the first power rail ($V_{DD}$) experiences a sharp decrease in voltage (e.g., a "glitch" due to a component coupled to the first power rail ($V_{DD}$) turning on or off, due to an inductive spike during current switching, etc.) and then returns to its normal voltage level. Because of the RC filter 303a, the voltage of the first node 307 is unable to discharge fast enough to turn ON the comparator PFET 313, and thus inadvertently inactivate the output transistors 219, prior to the voltage of the first power rail ($V_{DD}$) returning to its normal operating voltage. For example, in FIG. 4B the voltage of the fourth node 347 (gatep) remains unaltered despite the $V_{DD}$ glitch, indicating that the tristate inactivation devices 217 were not activated.

Between times $t_3$ and $t_4$, the voltage of the first power rail ($V_{DD}$) drops to zero, and the voltage of the first node 307 ($V_{DDDELAY}$) tracks the first power rail voltage after a delay as previously described. At time $t_4$, the comparator PFET 313 turns ON, and the output transistors 219 are inactivated as evidenced by the voltage of the fourth node 347 (gatep) being pulled high as shown.

Between times $t_5$ and $t_6$, the voltage of the first power rail (VDD) increases from 0 to 2.5 volts, and the voltage of the first node 307 ($V_{DDDELAY}$) tracks the first power rail voltage after a delay (as previously described).

At time $t_6$, the voltage of the first node 307 ($V_{DDDELAY}$) exceeds the turn-ON voltage of the second driver NFET 321, the second driver NFET 321 turns ON and the voltage of the second node 315 is quickly pulled low. In response thereto, the output transistors 219 of the OCD tristate circuitry 301 are activated as previously described.

The foregoing description discloses only the preferred embodiments of the invention, modifications of the above disclosed apparatus and method which fall within the scope of the invention will be readily apparent to those of ordinary skill in the art. For instance, while the particular transistors, logic gates and RC filters described herein are preferred, other types may be similarly employed. While the PFET 313 represents the preferred embodiment for the comparator 211 when the voltages of the first and the second power rails ($V_{DD}$), ($V_{DDQ}$) are approximately the same, it will be understood that other comparator circuits may be employed, particularly when the voltages of the first and the second power rails ($V_{DD}$), ($V_{DDQ}$) are different. For example, the PFET 313 may be replaced by a plurality of stacked PFETs, by a differential amplifier that compares the voltage of the first power rail ($V_{DD}$) to a pre-determined and/or adjustable reference voltage or by any other comparator circuit known in the art.

Accordingly, while the present invention has been disclosed in connection with the preferred embodiments thereof, it should be understood that other embodiments may fall within the spirit and scope of the invention, as defined by the following claims.

What is claimed is:

1. An off chip driver circuit for an integrated circuit having a split rail power supply providing a first and a second voltage comprising:
   a detection circuit for generating a signal if the first voltage is low; and
   a tristate logic circuit for receiving the signal and for controlling the off chip driver whereby the detection circuit inactivates the off chip driver via the signal.

2. The off chip driver circuit of claim 1 wherein the detection circuit comprises a comparator circuit for comparing the first voltage to the second voltage and for generating the signal if the first voltage is less than the second voltage.

3. The off chip driver circuit of claim 1 wherein the detection circuit further comprises a filter circuit for setting a minimum time period that the first voltage must be low before the detection circuit generates the signal.

4. The off chip driver circuit of claim 1 wherein the detection circuit further comprises an inactivation driver circuit for generating an inactivation signal if the first voltage is low; and
   wherein the tristate logic circuit comprises a tristate inactivation circuit coupled to the inactivation driver circuit for inactivating the off chip driver in response to the inactivation signal.

5. An off chip driver circuit for an integrated circuit having a split rail power supply providing a first and a second voltage comprising:
   a tristate logic circuit for receiving an inactivation signal and for inactivating the off chip driver in response to the inactivation signal; and
   a detection circuit coupled to the tristate logic circuit and adapted to generate the inactivation signal if the first voltage is low.

6. The off chip driver circuit of claim 5 wherein the detection circuit comprises a comparator adapted to compare the first voltage to the second voltage and to generate the inactivation signal if the first voltage is less than the second voltage.

7. The off chip driver circuit of claim 6 wherein the comparator comprises a metal-oxide-semiconductor field-effect transistor.

8. The off chip driver circuit of claim 7 wherein the comparator comprises a p-channel metal-oxide-semiconductor field-effect transistor having a gate coupled to the first voltage, a source coupled to the second voltage and a drain that generates the inactivation signal if the first voltage is less than the second voltage.

9. The off chip driver circuit of claim 5 wherein the detection circuit further comprises a filter adapted to set a minimum time period that the first voltage must be low before the detection circuit generates the inactivation signal.

10. The off chip driver circuit of claim 9 wherein the filter comprises an RC filter.

11. The off chip driver circuit of claim 5 wherein the detection circuit comprises an inactivation driver adapted to generate the inactivation signal if the first voltage is low; and
    wherein the tristate logic circuit comprises a tristate inactivation circuit coupled to the inactivation driver for inactivating the off chip driver in response to the inactivation signal.

12. The off chip driver circuit of claim 11 further comprising:
    a first output transistor coupled to the tristate logic circuit and adapted to drive an output of the off chip driver to a first logic state in response to a first signal from the tristate logic circuit; and
    a second output transistor coupled to the tristate logic circuit and adapted to drive the output of the off chip driver to a second logic state in response to a second signal from the tristate logic circuit; and
    wherein the tristate inactivation circuit comprises:
    a first inactivation device coupled to the first output transistor and to the inactivation driver and adapted to turn off the first output transistor in response to the inactivation signal; and
    a second inactivation device coupled to the second output transistor and to the inactivation driver and adapted to turn off the second output transistor in response to the inactivation signal.

13. The off chip driver circuit of claim 12 wherein the first output transistor comprises a pull-up transistor adapted to pull high an output of the off chip driver and wherein the second output transistor comprises a pull-down transistor adapted to pull low the output of the off chip driver.

14. The off chip driver circuit of claim 12 wherein the first inactivation device comprises a p-channel metal-oxide-semiconductor field-effect transistor and wherein the second inactivation device comprises an n5 channel metal-oxide-semiconductor field-effect transistor.

15. The off chip driver circuit of claim 5 further comprising:
- a first output transistor coupled to the tristate logic circuit and adapted to drive an output of the off chip driver to a first logic state in response to a first signal from the tristate logic circuit; and
- a second output transistor coupled to the tristate logic circuit and adapted to drive the output of the off chip driver to a second logic state in response to a second signal from the tristate logic circuit; and
- wherein the detection circuit further comprises:
  - a comparator adapted to compare the first voltage to the second voltage and to generate an inactivation signal if the first voltage is less than the second voltage;
  - a filter adapted to set a minimum time period that the first voltage must be low before the detection circuit generates the inactivation signal; and an inactivation driver; and
- wherein the tristate logic circuit comprises a tristate inactivation circuit having:
  - a first inactivation device coupled to the first output transistor and to the inactivation driver and adapted to turn off the first output transistor in response to the inactivation signal; and
  - a second inactivation device coupled to the second output transistor and to the inactivation driver and adapted to turn off the second output transistor in response to the inactivation signal.

16. The off chip driver circuit of claim 15 wherein the inactivation driver comprises:
- a first plurality of transistors coupled to the comparator and to the first inactivation device and adapted to receive the inactivation signal from the comparator and to inactivate the first inactivation device in response thereto; and
  - a second plurality of transistors coupled to the comparator and to the second inactivation device and adapted to receive the inactivation signal from the comparator and to inactivate the second inactivation device in response thereto.

17. The off chip driver circuit of claim 5 wherein the tristate logic circuit comprises:
- tristate logic adapted to control an output of the off chip driver; and
- a tristate logic disable circuit coupled to the detection circuit and to the tristate logic and adapted to disable the tristate logic in response to the inactivation signal.

18. A method of protecting a signal network employing an off chip driver circuit for an integrated circuit having a split rail power supply providing a first and a second voltage, the method comprising:
- monitoring the first voltage;
- generating an inactivation signal if the first voltage is low; and
- inactivating the off chip driver in response to the inactivation signal.

19. The method of claim 18 wherein monitoring the first voltage comprises:
- comparing the first voltage to the second voltage; and
- wherein generating the inactivation signal if the first voltage is low comprises generating the inactivation signal if the first voltage is less than the second voltage.

20. The method of claim 18 wherein monitoring the first voltage comprises:
- filtering the first voltage; and
- monitoring the filtered first voltage; and
- wherein generating the inactivation signal if the first voltage is low comprises generating the inactivation signal if the first filtered voltage is low.

* * * * *

UNITED STATES PATENT AND TRADEMARK OFFICE
CERTIFICATE OF CORRECTION

PATENT NO. : 6,166,561
DATED : December 26, 2000
INVENTOR(S) : Fifield et al.

It is certified that error appears in the above-identified patent and that said Letters Patent are hereby corrected as shown below:

Column 1, Line 48, delete "VDD" and insert -- $V_{DD}$ --
Column 3, Line 50, delete "VDD" and insert -- $V_{SS}$ --
Column 4, Line 4, delete "VDD" and insert -- $V_{DD}$ --
Column 8, Line 19, delete "VDDDEAY" and insert -- $V_{DDDELAY}$ --
Column 9, Line 11, delete "VDD" and insert -- $V_{DD}$ --
Column 10, Line 66, delete "n 5" and insert -- n --

Signed and Sealed this

Twenty-ninth Day of May, 2001

Attest:

NICHOLAS P. GODICI

Attesting Officer     Acting Director of the United States Patent and Trademark Office